United States Patent
Wierer Jr. et al.

(10) Patent No.: US 7,012,279 B2
(45) Date of Patent: Mar. 14, 2006

(54) PHOTONIC CRYSTAL LIGHT EMITTING DEVICE

(75) Inventors: Jonathan J. Wierer Jr., Fremont, CA (US); Michael R. Krames, Mountain View, CA (US); Mihail M. Sigalas, Santa Clara, CA (US)

(73) Assignees: Lumileds Lighting U.S., LLC, San Jose, CA (US); Agilent Technologies, Inc., Palo Alto, CA (US)

( * ) Notice: Subject to any disclaimer, the term of this patent is extended or adjusted under 35 U.S.C. 154(b) by 125 days.

(21) Appl. No.: 10/691,026

(22) Filed: Oct. 21, 2003

(65) Prior Publication Data

US 2005/0082545 A1 Apr. 21, 2005

(51) Int. Cl.
*H01L 29/22* (2006.01)

(52) U.S. Cl. .............................. 257/94; 257/98; 438/32
(58) Field of Classification Search .................. 257/94, 257/98, 432; 438/32, 47

See application file for complete search history.

(56) References Cited

U.S. PATENT DOCUMENTS

| | | | |
|---|---|---|---|
| 5,338,944 A | 8/1994 | Edmond et al. | |
| 5,371,025 A | 12/1994 | Sung | |
| 5,779,924 A | 7/1998 | Krames et al. | |
| 5,955,749 A | * 9/1999 | Joannopoulos et al. | ....... 257/98 |
| 6,071,795 A | 6/2000 | Cheung et al. | |
| 6,156,581 A | 12/2000 | Vaudo et al. | |
| 6,307,218 B1 | 10/2001 | Steigerwald et al. | |
| 6,335,548 B1 | 1/2002 | Roberts et al. | |
| 6,363,096 B1 | 3/2002 | Dodabalapur et al. | |

(Continued)

FOREIGN PATENT DOCUMENTS

| | | |
|---|---|---|
| EP | 874 405 A2 | 10/1998 |
| EP | 1 071 143 A1 | 1/2001 |
| EP | 1 385 215 A2 | 1/2004 |
| JP | 07176788 | 7/1995 |
| WO | WO 03/023857 A2 | 3/2003 |
| WO | WO 2004/004827 A2 | 1/2004 |
| WO | WO 2004/032193 A2 | 4/2004 |
| WO | WO 2004/034025 A2 | 4/2004 |
| WO | WO 2004/038767 A2 | 5/2004 |

OTHER PUBLICATIONS

J. Ristic et al., "Characterization of Gan quantum discs embedded in AlxGa1–xN nanocolumns grown by molecular beam epitaxy," Physical Review B68, (2003), The American Physical Society, pp. 125305-1 to 125305-5.

J.Noborisaka et al., "Catalyst–free growth of GaAs nanowires by selective–area metalorganic vapor–phase epitaxy," Applied Physics Letters 86, (2005), American Institute of Physics, pp. 213102–1 to 213103–3.

(Continued)

*Primary Examiner*—Sara Crane
(74) *Attorney, Agent, or Firm*—Patent Law Group LLP; Rachel V. Leiterman

(57) ABSTRACT

A photonic crystal structure is formed in an n-type layer of a III-nitride light emitting device. In some embodiments, the photonic crystal n-type layer is formed on a tunnel junction. The device includes a first layer of first conductivity type, a first layer of second conductivity type, and an active region separating the first layer of first conductivity type from the first layer of second conductivity type. The tunnel junction includes a second layer of first conductivity type and a second layer of second conductivity type and separates the first layer of first conductivity type from a third layer of first conductivity type. A photonic crystal structure is formed in the third layer of first conductivity type.

38 Claims, 10 Drawing Sheets

U.S. PATENT DOCUMENTS

| | | |
|---|---|---|
| 6,528,082 B1 | 2/2003 | Corzine et al. |
| 6,559,075 B1 | 5/2003 | Kelly et al. |
| 6,770,353 B1 | 8/2004 | Mardilovich et al. |
| 6,831,302 B1 | 12/2004 | Erchak et al. |
| 2002/0004307 A1 | 1/2002 | Yamada |
| 2002/0130311 A1 | 9/2002 | Lieber et al. |
| 2003/0016895 A1 | 1/2003 | Holm et al. |
| 2003/0089899 A1 | 5/2003 | Lieber et al. |
| 2003/0141507 A1 | 7/2003 | Krames et al. |
| 2003/0222263 A1 | 12/2003 | Choi |
| 2003/0235229 A1 | 12/2003 | Deng et al. |
| 2004/0016936 A1 | 1/2004 | Tanaka et al. |
| 2004/0109644 A1 | 6/2004 | Assefa et al. |
| 2004/0207320 A1 | 10/2004 | Erchak |
| 2004/0207323 A1 | 10/2004 | Erchak et al. |
| 2005/0040419 A1 | 2/2005 | Erchak et al. |
| 2005/0051787 A1 | 3/2005 | Erchak et al. |
| 2005/0087754 A1 | 4/2005 | Erchak |
| 2005/0087757 A1 | 4/2005 | Erchak et al. |
| 2005/0145877 A1 | 7/2005 | Erchak |

OTHER PUBLICATIONS

T. Hamano et al., "New Technique for Fabrication of Two-Dimensional Photonic Bandgap Crystals by Selective Epitaxy," Jpn. J. Appl. Phys. vol. 36 (1997), pp. L286 to L288.

S. Haffouz et al., "Efect of Magnesium and Silicon on the lateral overgrowth of GaN patterened substrates by Metal Organic Vapor Phase Epitaxy," MRS Internet J. Nitride Semicond. Res. 3, 8 (1998), 1998–1999 The Materials Research Society, pp. 1 t0 6.

G. Kipshidze et al., "Controlled growth of GaN nanowires by pulsed metaloganic chemical vapor deposition" Applied Physics Letters 86, (2005) American Institute of Physics, pp. 033104–1 to 033104–3.

Kwa–Mok Kim et al., "Growth and characterization of single–crystal GaN nanorods by hydride vapor phrase epitaxy," Applied Physics Letters, vol. 81, No. 12, Sep. 16, 2002, pp. 2193 ton 2195.

S. Han et al, "Controlled growth of gallium nitride single-crystal nanowires using a chemical vapor deposition method," J. Mater. Res., vol. 18, No. 2, Feb. 2003, Materials Research Society, pp. 245 to 249.

Hwa–Mok Kim, et al., "Nanoscale Ultraviolet–Light–Emitting Diodes Using Wide–Bandgap Gallium Nitride Nanorods," Adv. Mater.2003, 15, No. 7–8, Apr. 17, Wiley–Vch Verlag GmbH & Co. KGaA, Weinheim, pp. 567 to 569.

T. Kuykendall et al., "Metaloganic Chemical Vapor Deposition Route to GaN Nanowires with Triangular Cross Sections," Nano Letters, 2003, vol. 3, No. 8, American Chemical Society, pp. 1063 to 1066.

Hwa–Mok Kim, et al., High–Brightness Light Emitting Diodes Using Dislocation–Free Indium Gallium Nitride/Gallium Nitride Multiquantum–Well Nanorod Arrays, Nano Letters 2004, vol. 4, No. 6, American Chemical Society, pp. 1059 to 1062.

V.V. Mamutin, et al., Growth of Self–Organized GaN Nanostructures on Al2O3 (0001) by RF MBE., Proc. Int. Workshop on Nitride Semiconductors, IPAP Conf. Series 1, pp. 413 to 416.

J. Su et al., "Catalytic growth of group III–nitride nanowires and nanostructures by metalorganic chemical vapor deposition," Applied Physics Letters 86, (2005), American Institute of Physics, pp. 013105–1 to 012105–3.

W. D. Zhou et al, "Electrically injected single–defect photonic bandgap surface–emitting laser at room temperature," Electronic Letters, Aug. 31st Aug. 2000, vol. 36, No. 18, pp. 1541 to 1542.

P. Bhattacharya et al., "Electrically Injected Photonic Bandgap Microcavity Light Sources," Leos 2001 14th. Annual Meeting of the IEEE Lasers & Electro–Optics Society, San Diego, Ca, Nov. 11–15, vol. 1 of 2, pp 76 to 77.

S. Kitamura et al, Fabrication of GaN Hexagonal Pyramids on Dot–Patterned GaN/Sapphire Substrates via Selective Metalorganic Vapor Phase Epitaxy, Jpn. J. Appl. Phys., vol. 34 (1995), Part 2, No. 9B, Sep. 15, 1995, pp. 1184 to L1186.

M. Nagahara et al., "Selective Growth of Cubic GaN in Small Areas on Patterned GaAs (100) Substrates by Metalorganic Vapor Phase Epitaxy," Jpn. J. Appl. Phys., vol. 33 (1994), Part 1, No. 1B, Jan. 1994, pp. 694 to 697.

A. Kikuchi et la., "Self–Organized InGan/Gan Multiple Quantum Well Nanocolumn Light Emitting Diodes Grown On (111) SI Substrate,"Department of Electrical and Electronics Engineering, Sophia University, 1 page.

European Search Report, 4 pages.

M. Fujita et al., "Organic light–emitting diode with ITO/organic photonic crystal," Electronics Letters, Nov. 27th 2003, vol. 39, No. 24, 2 pages.

D. Pisignano et al., "Planar organic photonic crystals fabricated by soft lithography," Institute of Physics Publishing Publishing, Nanotechnology 15 (2004), pp. 766–770.

T.N. Oder et al., "III–nitride blue and ultraivolet photonic crystal light emitting diodes," Applied Physics Letter, vol. 84, No. 4, Jan. 26 2004, pp. 466–468.

Hiroyuki Ichikawa et al., "Efficiency enhancement in a light–emitting diode with a two–dimensional surface grating photonic crystal," Applied Physics Letters, vol. 84, No. 4, Jan. 26, 2004, pp. 457–459.

J.J. Wierer et al., "InGaN/GaN quantum–well heterostructure light–emitting diodes employing photonic crystal structures," Applied Physics Letters, vol. 84, No. 19, May 10, 2004, pp. 3885–3887.

Lee et al., "Modified spontaneous emission from a two–dimensional photonic bandgap crystal slab," J. Opt. Soc. Am. B, vol. 17, No. 8, Aug. 2000, pp. 1438–1442.

Boroditsky et al., "Surface recomblantion measurements on III–V candidate materials for nanostructure light–emitting diodes," Journal of Applied Physics, vol. 87, No. 7, Apr. 1, 2000, pp. 3497–3504.

Boroditsky et al., "Light extraction from optically pumped light–emitting diode by thin–slab photonic crystals," Applied Physics Letters, vol. 75, No. 8 Aug. 23, 1999, pp. 1036–1038.

Windisch et al., "Light–emitting diodes with 31% external quantum efficiency by outcoupling of lateral waveguide models," Applied Physics Letters, vol. 74, No. 16, Apr. 19, 1999, pp. 2256–2258.

Xu et al., "Finite–difference time–domain calculation of spontaneous emission lifetime in a microcavity," J. Opt. Soc. Am. B, vol. 16, No. 3, Mar. 1999, pp. 465–474.

Hwang et al., "Spontaneous emission rate of an electric dipole in a general microcavity," Physical Review B, vol. 60, No. 7, Aug. 15, 1999, pp. 4688–4695.

Fan et al., "High Extraction Efficiency of Spontaneous Emission from Slabs of Photonic Crystals," Physical Review Letters, vol. 78, No. 17 Apr. 28, 1997, pp. 3294–3297.

Vuckovic et al., "Surface Plasmon Enhanced Light Emitting Diode," Journal of Quantum Electronics, vol. 36, 2000, pp. 1–13.

Tredicucci et al., "Single–mode surface–plasmon laser," Applied Physics Letters, vol. 76, No. 16, Apr. 17, 2000, pp. 2164–2166.

Imada et al., "Coherent two–dimensional lasing action in surface–emitting laser with triangular–lattice photonic cyrstal structure," Applied Physics Letts, vol. 75, No. 3, Jul. 19, 1999, pp. 316–318.

Pottage et al., "Vertical–cavity surface–emitting resonances in photonic crystal films," J. Opt. Soc. Am. A, vol. 18, No. 2, Feb. 2001, pp. 442–447.

Tiwari, S., "Compound Semiconductor Device Physics," Academic Press, Inc., San Diego, Ca, 1992, pp. 182–186.

G.B. Stringfellow and M. George Crawford, eds., "High Brightness Light Emitting Diodes," Academic Press, Inc., 1997, Chapter5, "AIGaInP Light–Emitting Diodes," by F.A. Kish and R.M. Fletcher, pp. 149–170.

P.A. Kohl, "Photoelectrochemical etching of semiconductors", IBM J. Res. Develop., vol. 42, No. 5, Sep. 5, 1998, pp. 629–637.

Chen–Fu Chu et al., "Comparison of p–Side Down and p–Side Up GaN Light–Emitting Diodes Fabricated by Laser Lift–Off", Jpn. J. Appl. Phys., vol. 42 (2003), Part 2, No. 2B, Feb. 15, 2003, pp. L147–L150.

W.S. Wong et al., "InxGa1-xN light emitting diodes on Si substrates fabricated by Pd–In metal bonding and laser lift–off", Applied Physics Letters, vol. 77, No. 18, Oct. 13, 2000, pp. 2822–2824.

H. Benisty et al., "Impact of Planar Microcavity Effects on Light Extraction –Part 1: Basic Concepts and Analytical Trends", IEEE Journal of Quantum Electronics, vol. 34, No. 9, Sep. 1998, pp. 1612–1631.

T. Fujii et al., "Increase in the extraction efficiency of GaN–based light–emitting diodes via surface roughening ", Applied Physics Letters, vol. 84, No. 6, Feb. 9, 2004, pp. 855–857.

Y.-K. Song et al., "Resonant–cavity InGaN quantum–well blue light–emitting diodes", Applied Physics Letters, vol. 77, No. 12, Sep. 18 2000, pp. 1744–1746.

* cited by examiner

PHOTONIC CRYSTAL LIGHT EMITTING DEVICE

BACKGROUND

1. Field of Invention

The present invention relates to semiconductor light emitting devices including photonic crystal structures.

2. Description of Related Art

Light emitting diodes ("LEDs") are technologically and economically advantageous solid state light sources. LEDs are capable of reliably providing light with high brightness, hence in the past decades they have come to play a critical role in numerous applications, including flat-panel displays, traffic lights, and optical communications. An LED includes a forward biased p-n junction. When driven by a current, electrons and holes are injected into the junction region, where they recombine and release their energy by emitting photons. The quality of an LED can be characterized, for example, by its extraction efficiency, which measures the intensity of the emitted light for a given number of photons generated within the LED chip. The extraction efficiency is limited, for example, by the emitted photons suffering multiple total internal reflections at the walls of the high refractive index semiconductor medium. As a result, the emitted photons do not escape into free space, leading to poor extraction efficiencies, typically less than 30%.

In the past thirty years, various approaches have been proposed to enhance the extraction efficiency of LEDs. The extraction efficiency can be increased, for example, by enlarging the spatial angle in which the emitted photons can escape by developing suitable geometries, including cubic, cylindrical, pyramidal, and dome like shapes. However, none of these geometries can entirely eliminate losses from total internal reflection.

A further source of loss is the reflection caused by the refractive index mismatch between the LED and the surrounding media. While such losses could be reduced with an anti-reflection coating, complete cancellation of reflection can be achieved only at a specific photon energy and one angle of incidence.

U.S. Pat. No. 5,955,749, entitled "Light Emitting Device Utilizing a Periodic Dielectric Structure," granted to J. Joannopoulos et al., describes an approach to the problem of enhancing the extraction efficiency. According to U.S. Pat. No. 5,955,749, a photonic crystal is created by forming a lattice of holes in the semiconductor layers of the light emitting diode. The lattice of holes creates a medium with a periodically modulated dielectric constant, affecting the way light propagates through the medium. The photons of the light emitting diode can be characterized by their spectrum or dispersion relation, describing the relation between the energy and the wavelength of the photons. The relationship may be plotted, yielding a photonic band diagram consisting energy bands, or photonic bands, separated by band gaps. Though the photonic band diagram is analogous to the spectrum of electrons in crystalline lattices as expressed in an electronic band diagram, the photonic band diagram is unrelated to the electronic band diagram. Photons with energies in the photonic band gap cannot propagate in the photonic crystal. The recombinative processes in a typical LED emit photons with a well-defined energy. If, therefore, a photonic crystal is formed in the LED such that the energy of the emitted photons falls within the photonic band gap of the photonic crystal, then all the emitted photons are emitted as radiative photons because no guided photons can exist with such energies. Since all the radiative photons are capable of escaping from the LED, this design increases the extraction efficiency of the LED.

In an effort to explore the usefulness of photonic crystals for light generation, U.S. Pat. No. 5,955,749 gives a partial description of a theoretical structure of a photonic crystal device.

U.S. Pat. No. 5,955,749 describes an n-doped layer, an active layer, a p-doped layer, and a lattice of holes formed in these layers. However, the device of U.S. Pat. No. 5,955,749 is not operational and therefore is not a LED. First, electrodes are not described, even though those are needed for the successful operation of a photonic crystal LED ("PXLED"). Though the fabrication of electrodes in regular LEDs is known in the art, for PXLEDs, neither the fabrication of electrodes, nor their influence on the operation of the PXLED is obvious. For example, suitably aligning the mask of the electrode layer with the lattice of holes may require new fabrication techniques. Also, electrodes are typically thought to reduce the extraction efficiency as they reflect a portion of the emitted photons back into the LED, and absorb another portion of the emitted light.

Second, U.S. Pat. No. 5,955,749 proposes fabricating photonic crystal light emitting devices from GaAs. GaAs is indeed a convenient and hence popular material for fabricating regular LEDs. However, it has a high surface recombination velocity of about $10^6$ cm/sec as described, for example, by S. Tiwari in "Compound Semiconductor Devices Physics," Academic Press (1992). The surface recombination velocity expresses the rate of the recombination of electrons and holes on the surface of the diode. Electrons and holes are present in the junction region of the LED, coming from the n-doped layer and the p-doped layer, respectively. When electrons and holes recombine across the electronic band gap, the recombination energy is emitted in the form of photons and generates light. However, when electrons and holes recombine through intermediate electronic states in the electronic band gap, then the recombination energy is emitted in the form of heat instead of photons, reducing the light emission efficiency of the LED. In an ideal crystal there are no states in the electronic band gap. Also, in today's high purity semiconductor crystals there are very few states in the electronic band gap in the bulk material. However, on the surface of semiconductors typically there are a large number of surface states and defect states, many of them in the electronic band gap. Therefore, a large fraction of electrons and holes that are close to the surface will recombine through these surface and defect states. This surface recombination generates heat instead of light, considerably reducing the efficiency of the LED.

This problem does not result in a serious loss of efficiency for regular LED structures. However, PXLEDs include a large number of holes, thus PXLEDs have a much larger surface area than regular LEDs. Therefore, the surface recombination may be capable of reducing the efficiency of the PXLED below the efficiency of the same LED without the photonic crystal structure, making the formation of photonic crystal structure pointless. Since GaAs has a high surface recombination velocity, it is not a promising candidate for fabricating photonic crystal LEDs. The seriousness of the problem is reflected by the fact that so far, to Applicants' knowledge, no operating LED with a photonic crystal near the active region has been reported in the literature that uses GaAs and claims an enhanced extraction, or internal, efficiency. In particular, U.S. Pat. No. 5,955,749 does not describe the successful operation of a photonic crystal LED. Also, U.S. Pat. No. 5,955,749 does not describe the influence of the photonic crystal on the emission process, which can affect the internal efficiency of the LED.

While photonic crystals are promising for light extraction for the reasons described above, there are problems with the design. There are several publications describing experiments on a lattice of holes having been formed in a slab of a semiconductor. An enhancement of the extraction rate at photon energies in the photonic band gap has been reported by R. K. Lee et al. in "Modified Spontaneous Emission From a Two-dimensional Photonic Bandgap Crystal Slab," in the Journal of the Optical Society of America B, vol. 17, page 1438 (2000). Lee et al. not only shows the extraction benefits of a photonic crystal in a light emitting design, but also shows that the photonic lattice can influence the spontaneous emission. However, Lee et al. do not show how to form and operate a light emitting device with this design. A photonic crystal LED can be formed from Lee et al.'s light emitting design by including electrodes. The addition of the electrodes, however, will substantially affect the extraction and the spontaneous emission. Since this effect is unknown, it cannot be disregarded in the design of a LED. Since the Lee et al. design does not include such electrodes, the overall characteristics of an LED formed from that design are unclear. This questions the usefulness of the design of Lee et al.

SUMMARY

In accordance with embodiments of the invention, a photonic crystal structure is formed on an n-type layer of a III-nitride light emitting device. In some embodiments, the photonic crystal n-type layer is formed over a tunnel junction. The device includes a first layer of first conductivity type, a first layer of second conductivity type, and an active region sandwiched between a layer of first conductivity type and a layer of second conductivity type. The tunnel junction includes a second layer of first conductivity type and a second layer of second conductivity type and separates the first layer of first conductivity type from a third layer of first conductivity type. A photonic crystal structure is formed in the third layer of first conductivity type.

DETAILED DESCRIPTION

Figure 1:
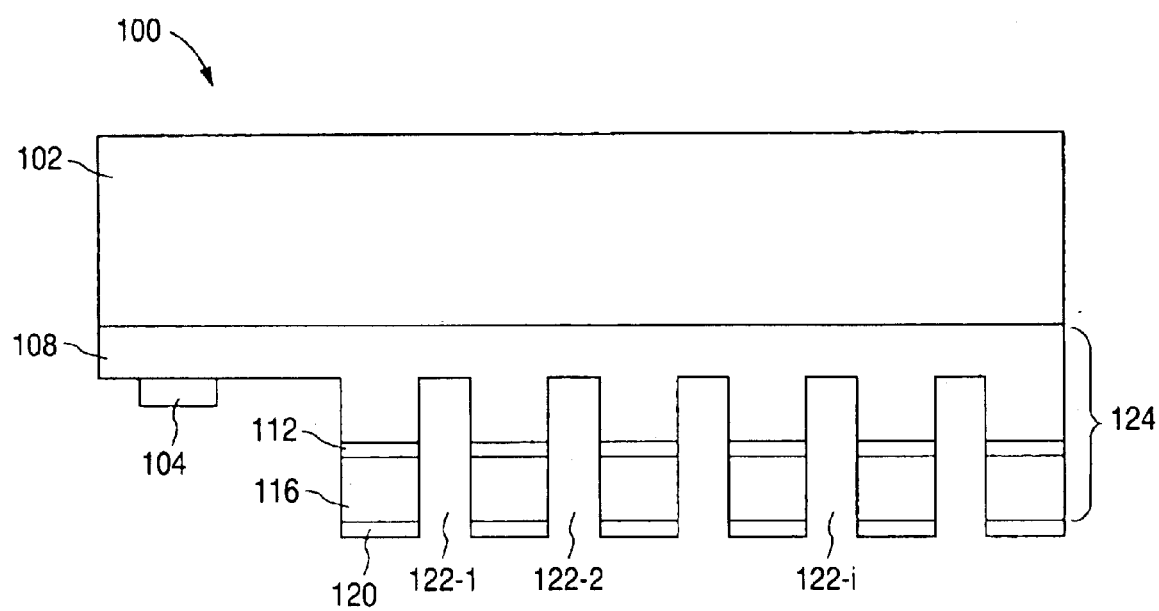
FIG. 1 is a cross sectional view of a photonic crystal light emitting diode.

FIG. 1 illustrates a III-nitride photonic crystal LED (PXLED) 100, described in more detail in application Ser. No. 10/059,588, "LED Efficiency Using Photonic Crystal Structure," filed Jan. 28, 2002 and incorporated herein by reference.

In PXLED 100 of FIG. 1, an n-type region 108 is formed over host substrate 102 which may be, for example, sapphire, SiC, or GaN; an active region 112 is formed over n-type region 108; and a p-type region 116 is formed over active region 112. Each of regions 108, 112, and 116 may be a single layer or multiple layers of the same or different composition, thickness, or dopant concentration. A portion of p-type region 116 and active region 112 are etched away to expose a portion of n-type region 108, then a p-contact 120 is formed on p-type region 116 and an n-contact 104 is formed on the exposed portion of n-type region 108.

Active region 112 includes a junction region where electrons from n-type region 108 combine with holes of p-type region 116 and emit energy of recombination in the form of photons. Active layer 112 may include a quantum well structure to optimize the generation of photons. Many different quantum well structures have been described, for example, by G. B. Stringfellow and M. George Craford in "High Brightness Light Emitting Diodes," published by the Associated Press in 1997. The photonic crystal of PXLED 100 of FIG. 1 is created by forming a periodic structure of holes 122-$i$ in the LED.

In the device illustrated in FIG. 1, a usual III-nitride structure is fabricated with the n-type region formed first on the substrate, followed by the active region and the p-type region. The photonic crystal device illustrated in FIG. 1 and the devices described in U.S. Pat. No. 5,955,749 may have several disadvantages. First, the photonic crystal structure in the device of FIG. 1 may be formed by, for example, dry etching into the p-type region to form a periodic structure. Dry etching could be reactive ion, inductively coupled plasma, focused ion beam, sputter etching, electron cyclotron resonance, or chemically assisted ion beam etching. Dry etching of p-type material is problematic because etching can damage the crystal, causing vacancies which create n-type donors. In p-type region 116, the presence of n-type donors lowers the concentration of holes and, in cases of severe damage to the crystal, can change the conductivity type of region 116 to n-type. The inventors have discovered that the damage caused by dry etching is not limited to a localized area around the etched region, and may propagate vertically and laterally through the non-etched areas of the crystal, possibly eliminating the p-n junction and rendering the device electrically non-operational. The devices described in U.S. Pat. No. 5,955,749 also etch through p-type material, and therefore may suffer from the same widespread damage observed by the inventors. Second, in both the device of FIG. 1 and the devices in U.S. Pat. No. 5,955,749, portions of the active region are removed to form the photonic crystal structure, reducing the amount of active region material and potentially reducing the amount of light generated in the device.

In accordance with embodiments of the invention, a photonic crystal structure is formed in an n-type region of the device, often in the last epitaxial layer of an epitaxial structure ending in an n-type layer. In some embodiments, an epitaxial structure ending in an n-type layer is achieved by first growing the p-type region, followed by the active region and n-type region. The photonic crystal may then be formed on the surface of the n-type region. Such a design may present challenges. First, the p-type dopant is often Mg. Unless difficult precautions are taken, residual Mg left in the reactor after growth of the p-type region will incorporate into the active region. Mg in the active region may decrease the light-generating efficiency of the device. Second, if the growth substrate is an insulating or poorly conducting substrate such as sapphire, both contacts must be formed on the epitaxial surface. Such a device structure has to rely on lateral currents in the p-type layers, creating high resistances in the device. To avoid the problem of lateral current spreading, the substrate may be removed. Growth on sapphire begins with growth of one or more undoped layers before doped layers are grown. The undoped layers must be etched away to reach the p-type layers to create a contact. The etching may damage the p-type crystal, potentially rendering it useless. Alternatively, a p-type conductive substrate such as SiC may be used rather than an insulating substrate, to avoid the problem of lateral currents and to avoid removing the substrate. However, p-type SiC is often resistive, requiring extra voltage to operate the device.

Figure 2:
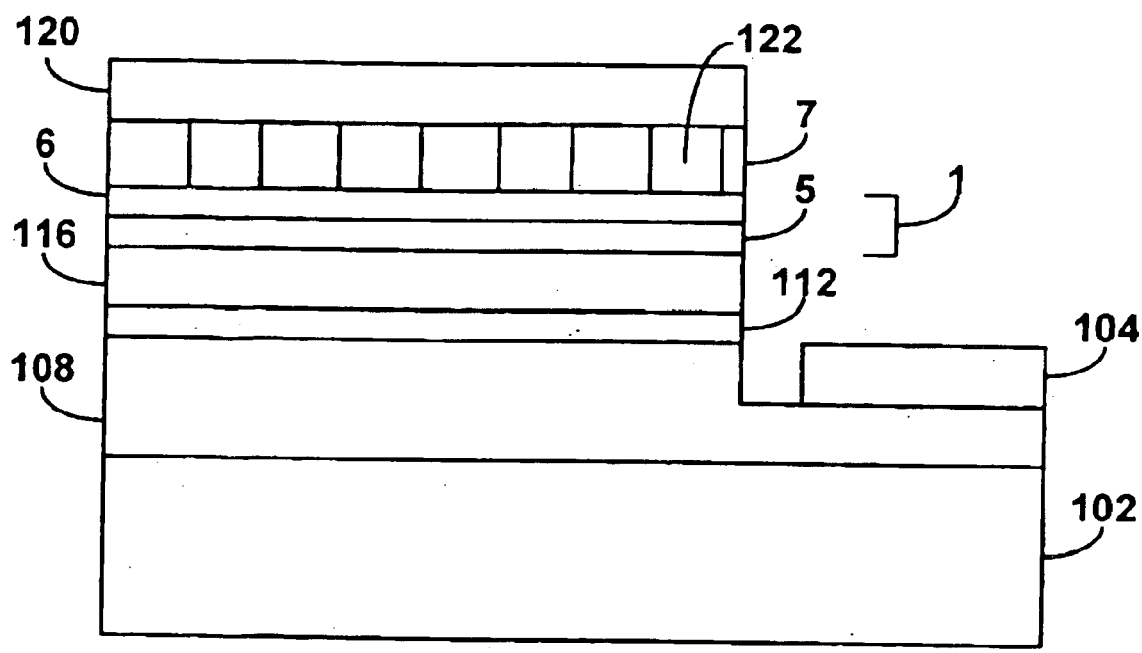
FIG. 2 is a cross sectional view of an embodiment of a photonic crystal light emitting device including a tunnel junction.

In other embodiments of the invention, the photonic crystal structure of a photonic crystal LED is formed in an n-type device layer grown on a tunnel junction. FIG. 2 illustrates a first embodiment of the invention. N-type region 108, active region 112, and p-type region 116 are formed on substrate 102 as in the device of FIG. 1. A tunnel junction 1 is then formed on p-type region 116. A second n-type region 7 is formed over the tunnel junction. The photonic crystal structure is formed in n-type region 7. The photonic crystal structure is a periodic variation in the index of retraction in a device, generally created by forming an array of holes 122 in n-type region 7. The holes may be filled with air or another material that does not absorb light and has an index of refraction that is a high contrast to the index of refraction of n-type region 7. An example of a suitable material is a dielectric layer. The structure of the photonic crystal structure is described in more detail below. Contacts 120 and 104 are attached to n-type region 7 and n-type region 108.

Tunnel junction 1 includes a highly doped p-type layer 5, also referred to as a p++ layer, and a highly doped n-type layer 6, also referred to as an n++ layer. P++ layer 5 may be, for example, AlGaN, AlInGaN, InGaN or GaN, doped with an acceptor such as Mg or Zn to a concentration of about $10^{18}$ cm$^{-3}$ to about $5 \times 10^{20}$ cm$^{-3}$. In some embodiments, p++ layer 5 is doped to a concentration of about $2 \times 10^{20}$ cm$^{-3}$ to about $4 \times 10^{20}$ cm$^{-3}$. N++ layer 6 may be, for example, AlGaN, AlInGaN, InGaN or GaN, doped with a donor such as Si, Ge, or Se to a concentration of about $10^{18}$ cm$^{-3}$ to about $5 \times 10^{20}$ cm$^{-3}$. In some embodiments, n++ layer 6 is doped to a concentration of about $7 \times 10^{19}$ cm$^{-3}$ to about $9 \times 10^{19}$ cm$^{-3}$. Tunnel junction 1 is usually very thin; for example, tunnel junction 100 may have a total thickness ranging from about 2 nm to about 100 nm, and each of p++ layer 5 and n++ layer 6 may have a thickness ranging from about 1 nm to about 50 nm. In some embodiments, each of p++ layer 5 and n++ layer 6 may have a thickness ranging from about 25 nm to about 35 nm. P++ layer 5 and n++ layer 6 may not necessarily be the same thickness. In one embodiment, p++ layer 5 is 15 nm of Mg-doped InGaN and n++ layer 6 is 30 nm of Si-doped GaN.

P++ layer 5 and n++ layer 6 may have a graded dopant concentration. For example, a portion of p++ layer 5 adjacent to the underlying player 4 may have a dopant concentration that is graded from the dopant concentration of the underlying p-type layer to the desired dopant concentration in p++ layer 5. Similarly, n++ layer 6 may have a dopant concentration that is graded from a maximum adjacent to p++ layer 5 to a minimum adjacent to n-type layer 7.

Tunnel junction 1 is fabricated to be sufficiently thin and sufficiently doped that carriers can tunnel through tunnel junction 1, thus tunnel junction 1 displays low series voltage drop when conducting current in reverse-biased mode. In some embodiments, the voltage drop across tunnel junction 1 is about 0.1V to about 1V. Preferably, the voltage drop across the tunnel junction is 0V. Tunnel junction 1 is fabricated such that when a voltage drop is applied across contacts 104 and 120 such that the p-n junction between active region 112 and p-type region 116 is forward biased, tunnel junction 100 quickly breaks down and conducts in the reverse-bias direction with a minimal voltage drop. Each of the layers in tunnel junction 1 need not have the same composition, thickness, or dopant composition. Tunnel junction 1 may also include an additional layer between p++ layer 5 and n++ layer 6 that contains both p- and n-type dopants.

Since contacts 120 and 104 are both formed on an n-type region, they may be the same material, though they need not be. Usually, contacts 120 and 104 are reflective of light emitted by active region 112. Examples of suitable contact materials include, for example, Al, Rh, and Ag. Contacts 120 and 104 may be multilayer structures. For example, contacts 120 and 104 may include a layer of aluminum adjacent to the semiconductor and a layer of an aluminum alloy over the layer of aluminum. Contact 120 formed on the photonic crystal structure may be a flat sheet of material bonded to n-type region 7 such that contact 120 is present over the holes 122 that form the photonic crystal structure, as shown in FIG. 2. Alternatively, contact 120 may be formed on n-type region 7 prior to formation of the photonic crystal structure, such that portions of contact 120 are removed as the photonic crystal structure is formed.

Figure 3:
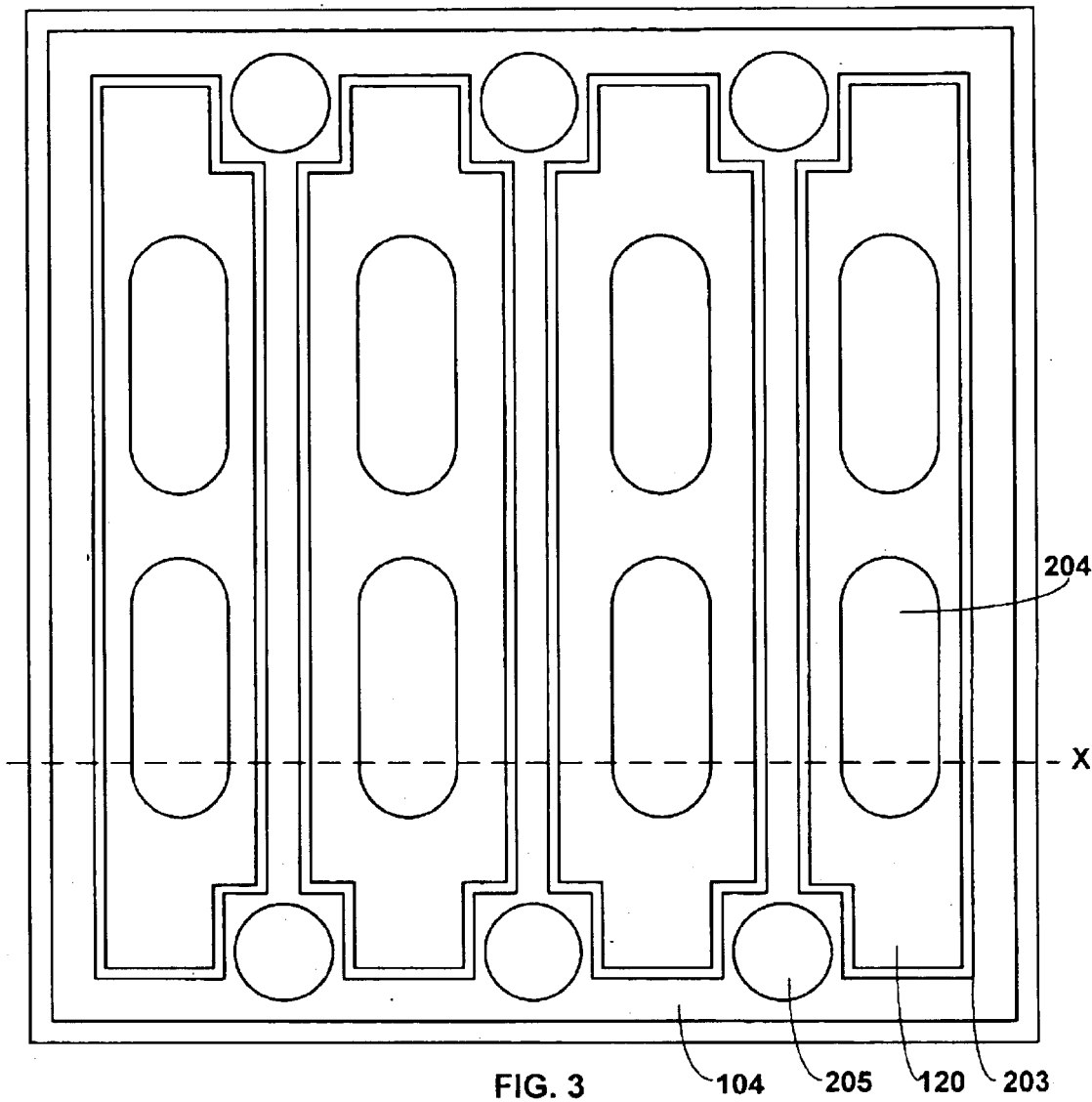
FIG. 3 is a plan view of an example of an arrangement of contacts for the device illustrated in FIG. 2.
Figure 4:
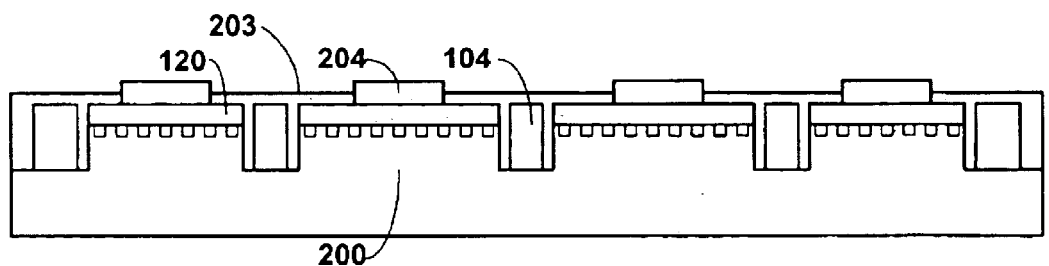
FIG. 4 is a cross sectional view of the device of FIG. 3.

FIGS. 3 and 4 illustrate an arrangement of contacts for the device of FIG. 2. FIG. 3 is a plan view and FIG. 4 is a cross sectional view along axis X of FIG. 3. The active region of epitaxial structure 200 (which includes layers 108, 112, 116, 5, 6, and 7 of FIG. 2) is separated into four regions separated by three trenches in which contacts 104 are formed. Each region is connected to a submount by eight p-submount connections 204 formed on contact 120. Contact 120 may be a bonded layer as illustrated in FIG. 2. Contact 104 surrounds the four active regions. Contact 104 is connected to a submount by six n-submount connections 205. Contacts 104 and 120 may be electrically isolated by an insulating layer 203.

Tunnel junction 1 allows the photonic crystal structure of the device to be formed in an n-type region 7. Etching the photonic crystal structure in an n-type region rather than a p-type region avoids the type-conversion problem associated with p-type III-nitrides, described above. In addition, since the photonic structure in n-type region 7 is separated from p-type region 116 and active region 112, damage to these regions caused by etching the photonic structure is avoided. Further, tunnel junction 1 permits the photonic crystal structure to be formed without removing parts of the active region.

Tunnel junction 1 also acts as a hole spreading layer to distribute positive charge carriers in p-type region 116. Carriers in n-type III-nitride material have a much higher mobility than carriers in p-type III-nitride material, thus current can spread more readily in an n-type layer than a p-type layer. Since current spreading on the aside of the p-n junction occurs in n-type layer 7, devices including a tunnel junction may have better p-side current spreading than a device lacking a tunnel junction. In addition, since n-type can effectively spread current to the photonic crystal area, contact 120 can be spaced apart from the photonic crystal area, reducing the effect of absorption of contact 120 on the photonic crystal.

Figure 5:
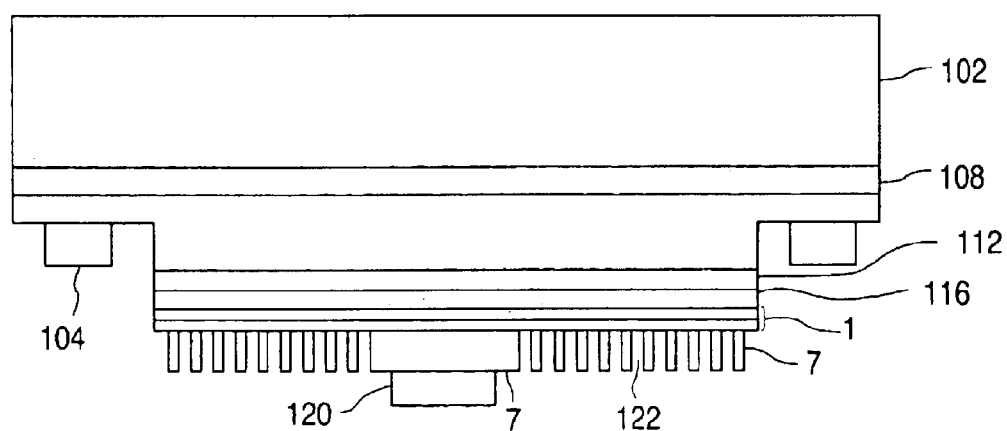
FIG. 5 is a cross sectional view of an alternative embodiment of a photonic crystal light emitting device including a tunnel junction.
Figure 6:
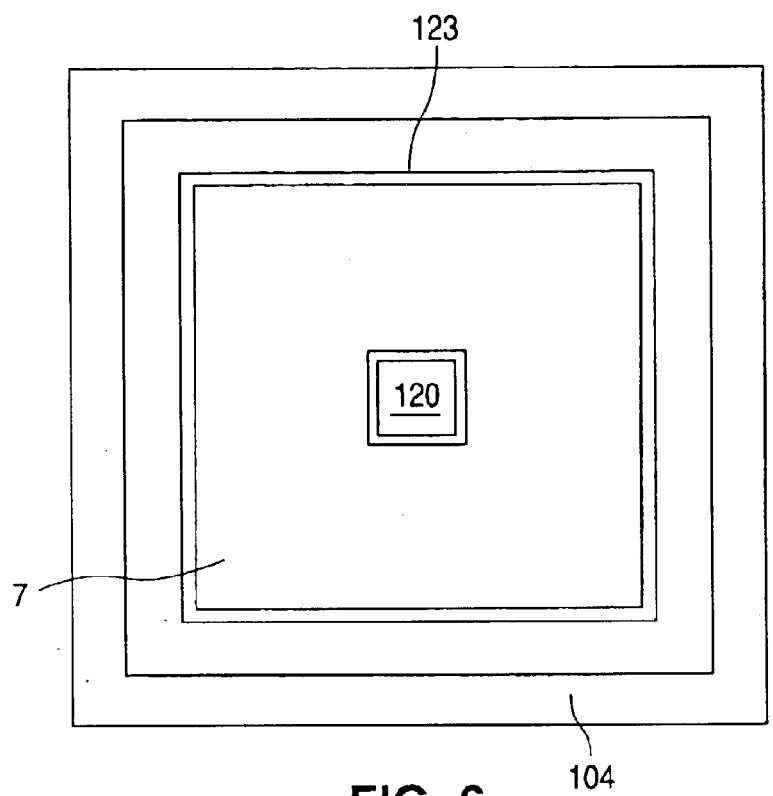
FIG. 6 is a plan view of the device of FIG. 5.

FIGS. 5–9 illustrate two photonic crystal devices that take advantage of current spreading in n-type material 7. FIG. 5 is a cross sectional view of an embodiment of the invention. FIG. 6 is a plan view of the device of FIG. 5. In the device of FIGS. 5 and 6, the photonic crystal structure is formed in a portion of n-type region 7. Contact 104 is formed outside mesa 123. Contact 120 is formed on the portion of n-type region 7 that is not textured with the photonic crystal structure. Since contact 120 is formed on a planar surface of n-type region 7, bonding contact 120 to n-type region 7 can be avoided and contact 120 can be deposited by techniques such as evaporation, sputtering, or plating, which may result in a higher quality contact than a bonded contact. Since region 7 is an n-type region, current will spread in n-type region 7 away from contact 120, permitting the use of a contact that need not touch all or a majority of the semiconductor material in n-type region 7. Contact 120 may be reflective, transparent, or semitransparent. The device illustrated in FIGS. 5 and 6 may be mounted such that light is extracted through substrate 102, that is, in a flip chip configuration, or from the epitaxial side of the device through contacts 104 and 120 and n-type region 7. In embodiments where light is extracted from the epitaxial side of the device, a reflective layer may be formed on the back of substrate 102, to reflect any downward light towards the emission surface.

Figure 7:
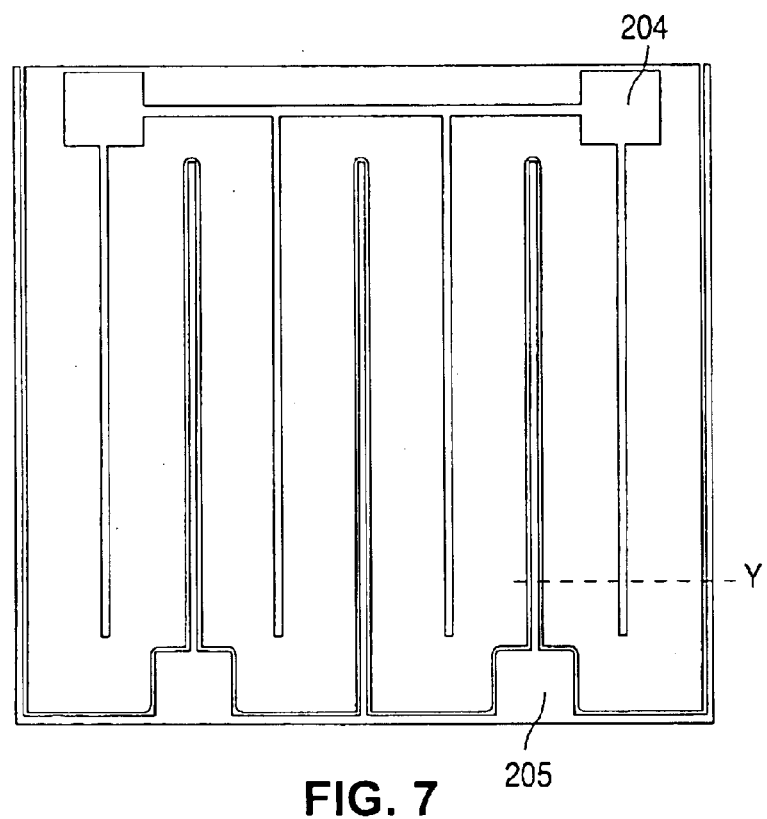
FIG. 7 is a plan view of an alternative arrangement of contacts for the device illustrated in FIG. 5.
Figure 8:
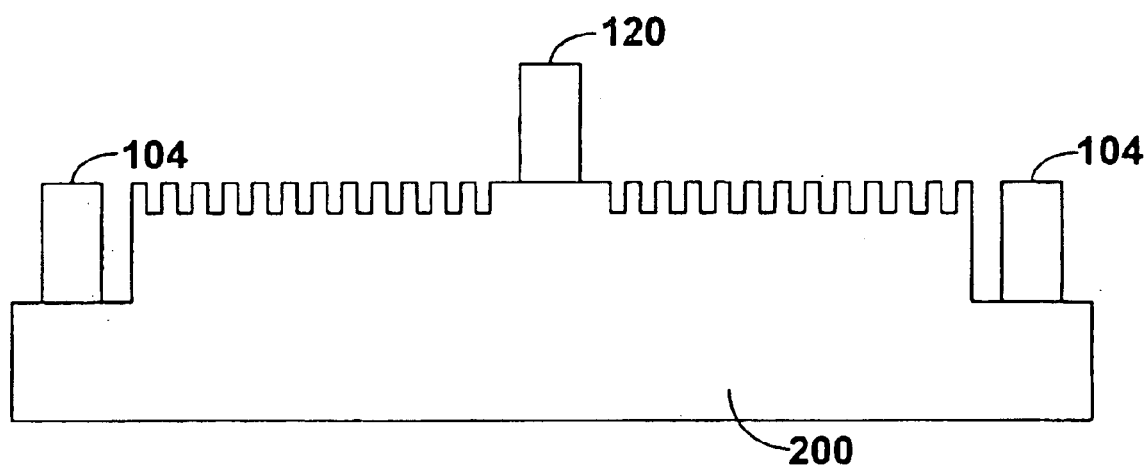
FIG. 8 is a cross section view of a portion of the device of FIG. 7.

FIGS. 7 and 8 illustrate an alternative arrangement of contacts for the device of FIG. 5. FIG. 7 is a plan view of the device and FIG. 8 is a cross sectional view of a portion of the device along axis Y. Each of contact 104 and contact 120 has fingers which interpose the fingers of the opposite contact. Bonding pads 204 and 205 electrically connect the device to a submount or other device by, for example, a wire bond.

Figure 9:
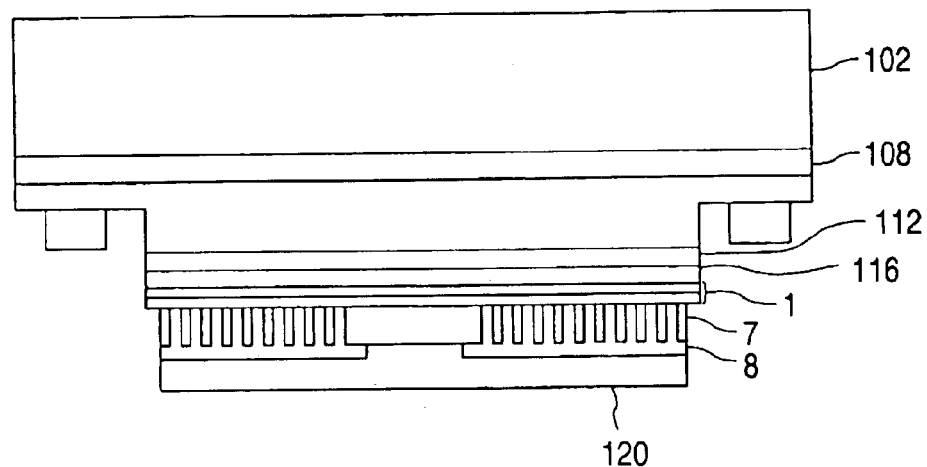
FIG. 9 is a cross sectional view of another alternative embodiment of a photonic crystal light emitting device including a tunnel junction.

In the device of FIG. 9, a portion of n-type region 7 is textured with a photonic crystal structure and a portion is left untextured. A dielectric material 8 is formed over n-type region 7 and may or may not fill in the holes of the photonic crystal structure. Dielectric material 8 is patterned and etched to expose the untextured portion of n-type region 7, then contact 120 is deposited. Contact 120 extends over dielectric material 8 and contacts the exposed, untextured portion of n-type region 7. As in the device of FIG. 5, current will spread in n-type region 7 away from contact 120. The device of FIG. 9 is simple to mount in flip chip configuration due to the large surface area of contact 120. In addition, contact 120 may permit high current operation by efficiently carrying heat away from the active region of the device of FIG. 9.

Though FIGS. 2–9 show devices with tunnel junctions 1 formed after the active region (that is, below the active region in the flip chip configuration illustrated in FIGS. 2–9), in alternative embodiments tunnel junction 1 may be formed before the active region such that the device layers are grown in the following order: n-type region 108 tunnel junction layer 6, tunnel junction layer 5, p-type region 116, active region 112, then n-type region 7.

The photonic crystal structure can include a periodic variation of the thickness of n-type region 7, with alternating maxima and minima. An example is a planar lattice of holes 122. The lattice is characterized by the diameter of the holes, d, the lattice constant a, which measures the distance between the centers of nearest neighbor holes, the depth of the holes w, and the dielectric constant of the dielectric, disposed in the holes, $\epsilon_h$. Parameters a, d, w, and $\epsilon_h$ influence the density of states of the bands, and in particular, the density of states at the band edges of the photonic crystal's spectrum. Parameters a, d, w, and $\epsilon_h$ thus influence the radiation pattern emitted by the device, and can be selected to enhance the extraction efficiency from the device.

Holes 122-i can have circular, square, hexagonal, or other cross sections. In some embodiments, the lattice spacing a is between about $0.1\lambda$ and about $10\lambda$, preferably between about $0.1\lambda$ and about $4\lambda$, where $\lambda$ is the wavelength in the device of light emitted by the active region. In some embodiments, holes 122 may have a diameter d between about 0.1 a and about 0.5 a, where a is the lattice constant, and a depth w between zero and the full thickness of n-type region 7 in which the photonic crystal structure is formed. In some embodiments, holes 122 have a depth between about $0.05\lambda$ and about $5\lambda$. Generally, holes 122 are formed entirely within n-type layer 7 and do not penetrate beyond the top layer of the tunnel junction. N-type region 7 is designed to be thick enough to form holes and to spread current and usually has a thickness of about 0.1 microns or more. The depth of holes 122 is selected to place the bottoms of holes 122 as close to the active region as possible, without penetrating layers which may cause problems such as the type conversion problem described above. Holes 122-i can be filled with air or with a dielectric of dielectric constant $\epsilon_h$, often between about 1 and about 16. Possible dielectrics include silicon oxides.

Figure 10:
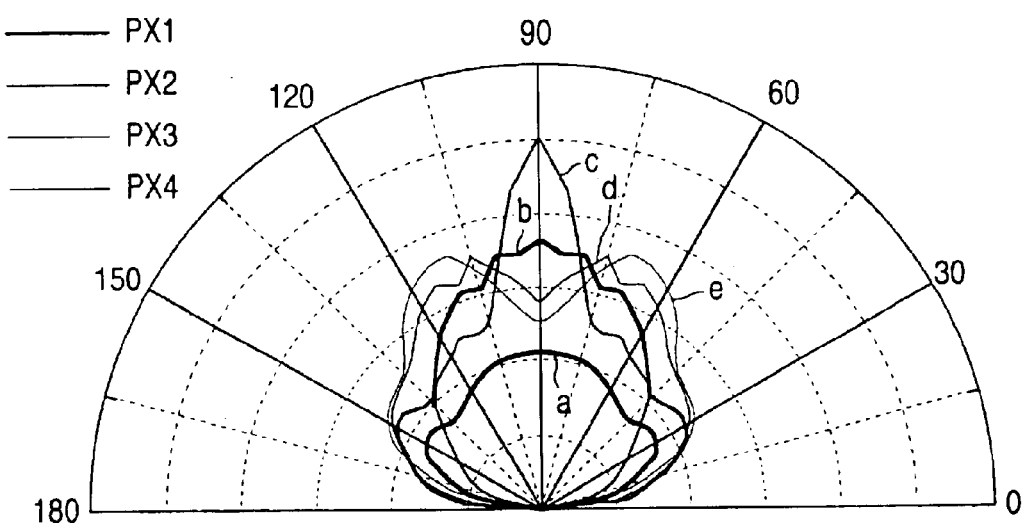
FIG. 10 illustrates the radiation patterns emitted by a device without a photonic crystal and four devices with photonic crystal structures.
Figure 11:
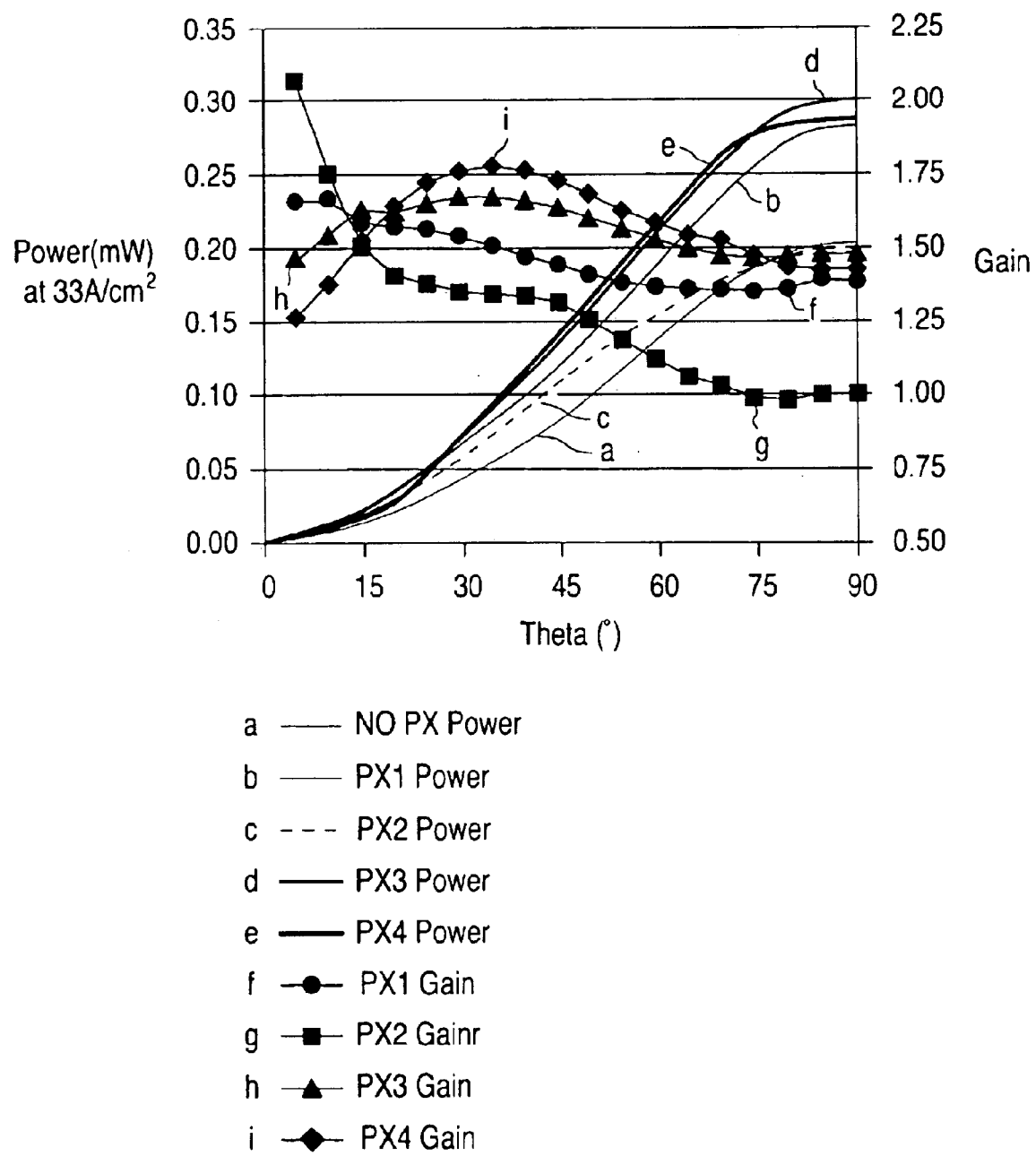
FIG. 11 illustrates the output power of a device without a photonic crystal and four device with photonic crystal structures.

FIG. 10 illustrates the effect of lattice parameter a, diameter d, and depth w on the emitted radiation pattern. FIG. 11 illustrates the effect of lattice parameter a, diameter d, and depth w on the extraction efficiency. Data observed from five devices are illustrated in FIGS. 10 and 11, a device fabricated as shown in FIGS. 5 and 6 without a photonic crystal structure and four devices fabricated as shown in FIGS. 5 and 6 with photonic crystal structures comprising a triangular lattice of holes filled with air. The lattice constant, diameter, and depth are listed in the following table:

| Device | Lattice param. a (nm) | Diameter d (nm) | Depth w (nm) |
| --- | --- | --- | --- |
| PX1 | 270 | 200 | 53 |
| PX2 | 295 | 220 | 90 |
| PX3 | 315 | 235 | 105 |
| PX4 | 340 | 250 | 129 |

In FIG. 10, 90 degrees represents light emitted from the top of the device, along the growth direction of the LED layers. Zero and 180 degrees represent light emitted from the sides of the device. As illustrated in FIG. 10, the radiation pattern emitted from the device changes based on the lattice parameter, diameter of holes, and depth of holes. The device lacking a photonic crystal structure, curve a, has a typical lambertian radiation pattern, with a peak at 90, and two peaks at 30, and 150 resulting from light escaping the device at the mesa edge. Curves b-e, corresponding to photonic crystal device PX1–PX4 are significantly different from curve a. For example, curve b has approximately seven peaks, curve c has approximately 3 peaks, curve d has approximately 6 peaks, and curve e has approximately 4 peaks. Curves b and c have maxima at 90 degrees, while curves d and e have local minima at 90, and peaks at about 70–75 degrees and 105–110 degrees. FIG. 10 demonstrates that the presence and shape of a photonic crystal structure in a device affects the direction light is emitted from the device. The radiation pattern can be modified by changing the photonic crystal parameters. For example, devices including photonic crystals with the photonic crystal parameters of PX1 and PX2 may be used in an application requiring top emission (90 degrees), while devices including photonic crystals with the photonic crystal parameters of PX3 and PX4 may be favored in an application requiring more side emission. As is clear from FIG. 10, at most angles, the presence of any of the photonic crystals illustrated improves the amount of light output from the device.

FIG. 11 illustrates the power (curves a-e) of the five devices listed above, integrated versus angle, such that the total power is given at 90 degrees. The results shown in FIG. 11 are for devices with a die size of 170 by 170 microns, operated at a current density of 33 A/cm$^2$, and emitting into air with no encapsulation. Photonic crystal devices PX1, PX3, and PX4 output nearly 50% more power than the device without a photonic crystal, between about 0.28 mW and about 0.30 mW for the photonic crystal devices, vs. about 0.20 mW for the device without a photonic crystal. FIG. 11 also lists the gain (curves f-i), defined as the ratio of output power from the photonic crystal LED to output power of the device without a photonic crystal, of the four photonic crystal devices. Each of the photonic crystal devices demonstrates significant gain at small angles. Photonic crystal device PX4 has a gain of about 1.7x compared to the device without a photonic crystal, at 30 degrees, indicating that PX4 is useful in applications requiring light emitted near normal to the device. Photonic crystal devices PX-1, PX-3, and PX4 each have a total gain of about 1.4.

Figure 12:
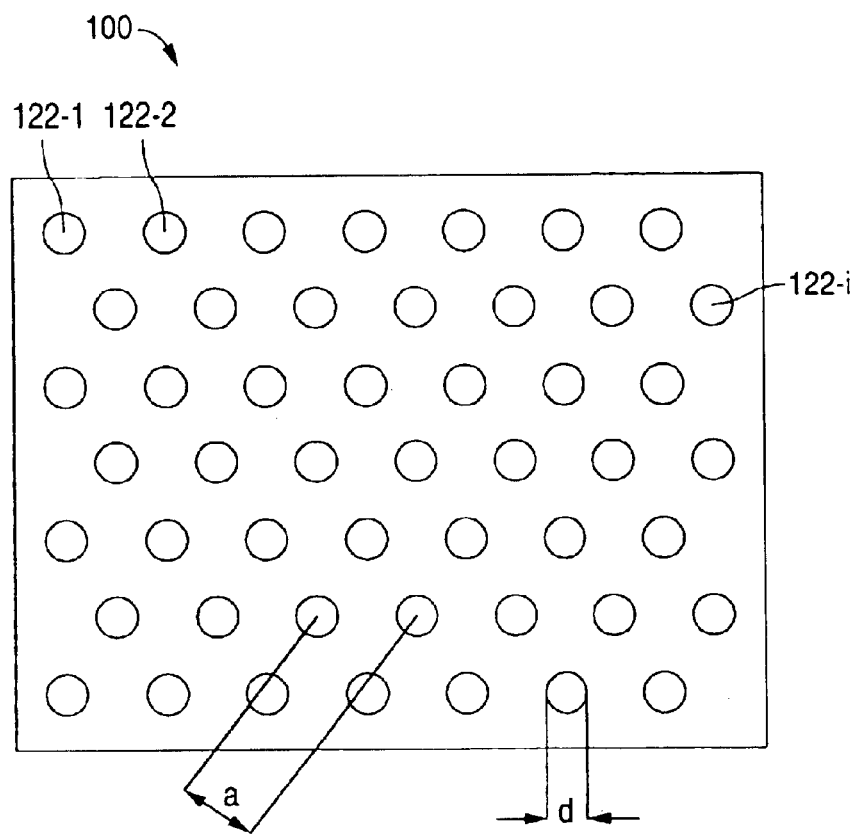
FIG. 12 is a top view of a triangular lattice photonic crystal.
Figure 13:
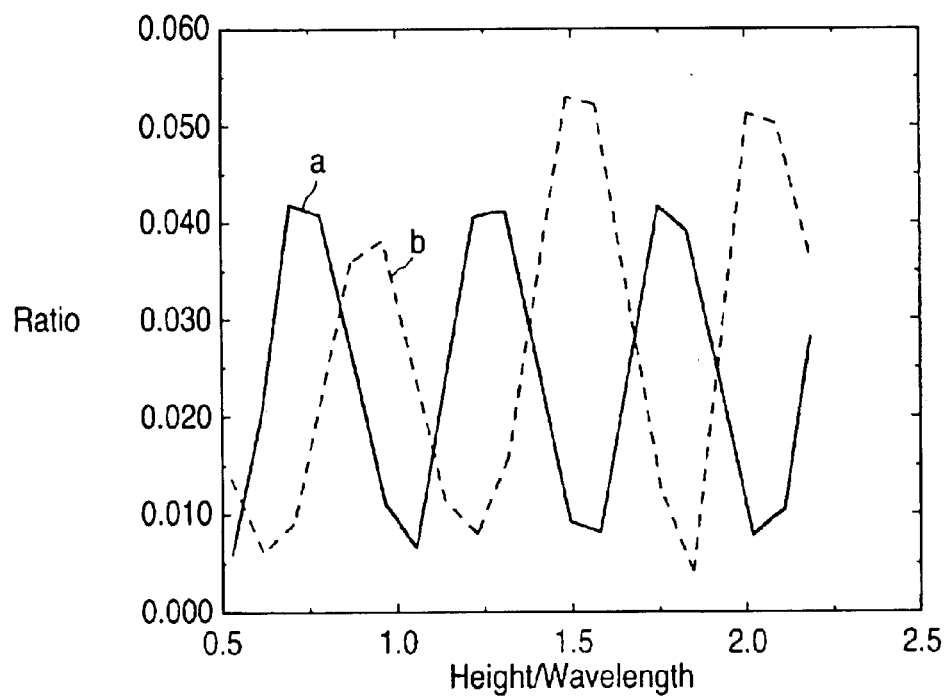
FIG. 13 is a plot of the ratio of output power emitted into a 12 degree exit cone to total output power as a function of dipole depth divided by wavelength, for a device without a photonic crystal and a device with a triangular lattice photonic crystal.

The lattice structure of the lattice of holes 122-i also influences the extraction. In various embodiments, holes 122-i form triangular, square, hexagonal, honeycomb, and other well-known two-dimensional lattice types. In some embodiments, different lattice types are formed in different regions of the device. FIG. 12 illustrates a photonic crystal structure, formed as a triangular lattice of holes 122-i. FIG. 13 illustrates, for a triangular lattice photonic crystal device according to FIG. 2 (curve b) and a device without a photonic crystal (curve a), a computer model of the ratio of output power emitted into a 12 degree exit cone to total output power, as a function of quantum well depth (also referred to as dipole depth) divided by wavelength. The dipole depth is the distance between a quantum well and the epitaxial surface of the photonic crystal surface of the device. The ratio of hole depth to lattice constant a is 1.25, the ratio of hole radius to lattice constant is 0.36, and the ratio of dipole depth to lattice constant is 1.72. The photonic crystal device has a maximum in light output at a ratio of dipole depth to wavelength of about 1.6. At the maximum in light output, the ratio of output power in a twelve degree cone to total output power of the photonic crystal device is 20% greater than the maximum in light output for the device without a photonic crystal.

Figure 14:
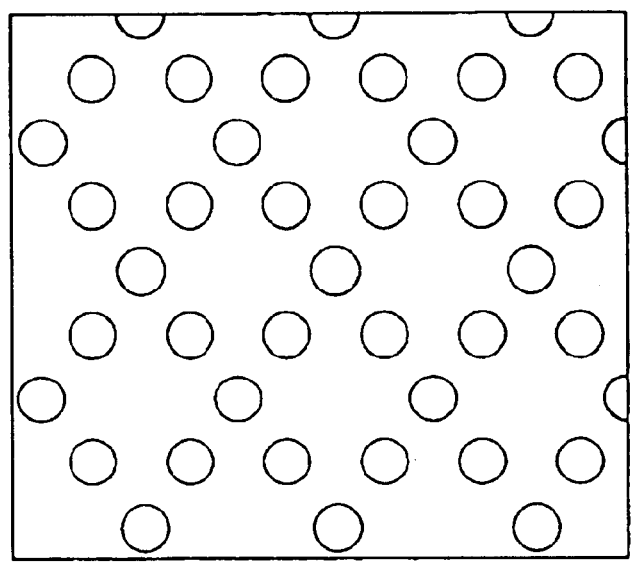
FIG. 14 is a top view of a honeycomb lattice photonic crystal.
Figure 15:
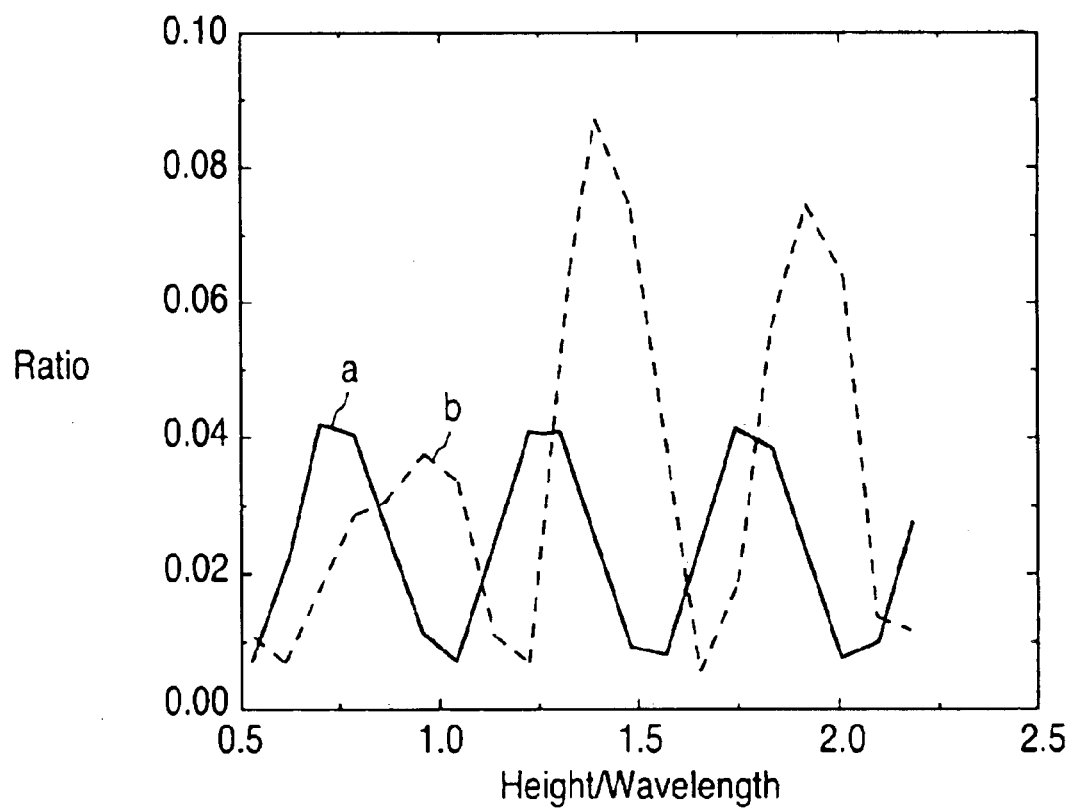
FIG. 15 is a plot of the ratio of output power emitted into a 12 degree exit cone to total output power as a function of dipole depth divided by wavelength, for a device without a photonic crystal and a device with a honeycomb lattice photonic crystal.

FIG. 14 illustrates a photonic crystal structure, formed as a honeycomb lattice of holes 122-i. FIG. 15 illustrates, for a honeycomb lattice photonic crystal device according to FIG. 2 (curve b) and a device without a photonic crystal (curve a), a computer model of the ratio of output power emitted into a 12 degree exit cone to total output power, as a function of dipole depth divided by wavelength. As in FIG. 13, the ratio of hole depth to lattice constant a is 1.25, the ratio of hole radius to lattice constant is 0.36, and the ratio of dipole depth to lattice constant is 1.72. The photonic crystal device has a maximum in light output at a ratio of dipole depth to wavelength of about 1.4. At the maximum in light output, the ratio of output power in a twelve degree cone to total output power of the photonic crystal device is twice the maximum in light output for the device without a photonic crystal.

FIGS. 13 and 15 illustrate that the lattice structure and distance between the active region and the photonic crystal can be selected to preferentially emit light in a chosen direction. For example, in the photonic crystal devices illustrated in FIGS. 13 and 15, at a value of dipole depth divided by wavelength of about 1.5, the ratio of output power emitted into a 12 degree exit cone to total output power is at a maximum, indicating that light is preferentially emitted into a narrow top escape cone. In addition, the maximum in FIG. 15 (the honeycomb lattice device) is greater than the maximum in FIG. 13 (the triangular lattice device), indicating that a honeycomb lattice emits a greater portion of light into a narrow top escape cone than a triangular lattice device of the same structure.

In some embodiments the periodic structure is a variation of the thickness of one or more selected semiconductor layers. The periodic structure can include variations of the thickness along one direction within the plane of the semiconductor layers, but extending along a second direction without variation, in essence forming a set of parallel grooves. Two-dimensional periodic variations of the thickness include various lattices of indentations.

Figure 16:
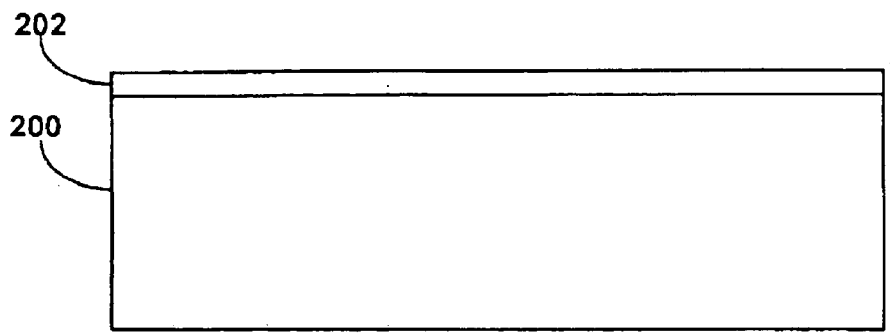
FIGS. 16–19 illustrate a method of forming a photonic crystal device.
Figure 17:
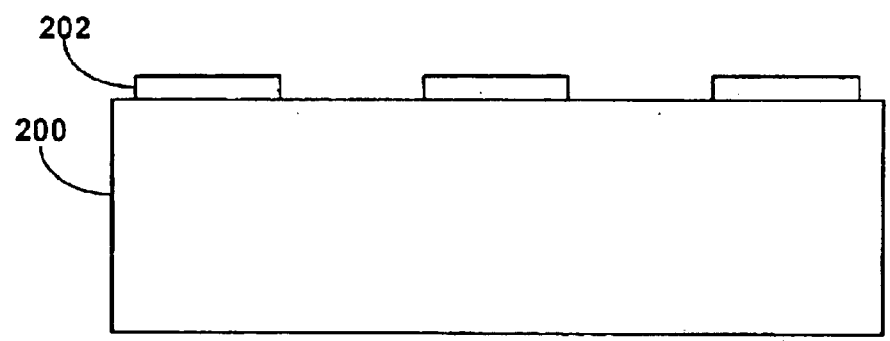
Figure 18:
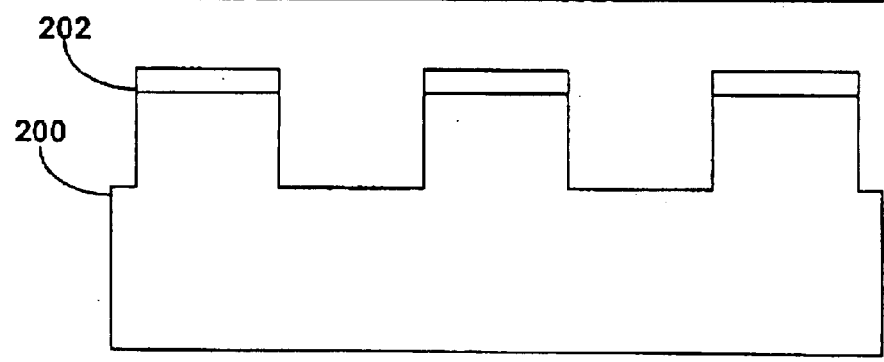
Figure 19:
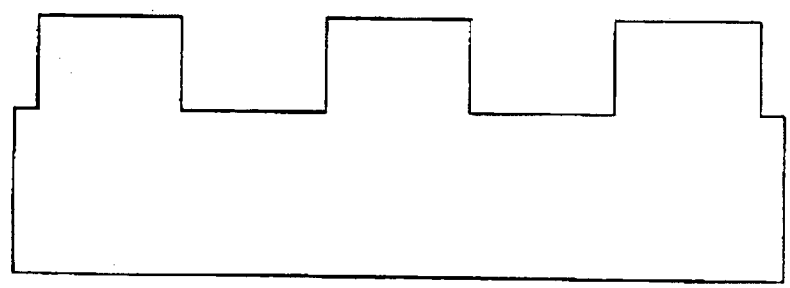

FIGS. 16–19 illustrate a method of fabricating the photonic crystal devices of FIGS. 1–5. Epitaxial regions 200, which may include regions 108, 112, 5, 6, and 7 of FIGS. 2–9 are formed over a substrate (not shown) by usual deposition techniques. One or more resist, metal, or dielectric layers 202 are formed over the top surface of the epitaxial layers, as illustrated in FIG. 16. Resist layers 202 are patterned to form a lattice of openings in FIG. 17, using a high resolution lithography technique such as electron beam lithography, nano-imprint lithography, deep X-ray lithography, interferometric lithography, hot embossing, or microcontact printing. In FIG. 18, epitaxial layers 200 are etched using known etching techniques. Damage caused by dry etching can be mitigated by a subsequent short wet chemical etch, anneal, a combination thereof, or other surface passivation techniques. The remaining resist layer 202 is then removed in FIG. 19. Other techniques for forming a photonic crystal, such as epitaxial lateral overgrowth, are described in more detail in application Ser. No. 10/059,588, "LED Efficiency Using Photonic Crystal Structure."

Having described the invention in detail, those skilled in the art will appreciate that, given the present disclosure, modifications may be made to the invention without departing from the spirit of the inventive concept described herein.

Therefore, it is not intended that the scope of the invention be limited to the specific embodiments illustrated and described.

What is being claimed is:

1. A light emitting device comprising:
    a III-nitride semiconductor structure including an active region disposed between an n-type and a p-type region; and
    a photonic crystal structure formed in an n-type region;
    wherein the p-type region is substantially planar and the photonic crystal structure does not extend into the p-type region.

2. The device of claim 1 wherein the photonic crystal structure comprises a periodic variation in a thickness of the n-type region.

3. The device of claim 1 wherein the photonic crystal structure comprises a planar lattice of holes.

4. The device of claim 3 wherein the lattice has a lattice constant a between about $0.1\lambda$ and about $10\lambda$, wherein $\lambda$ is a wavelength of light emitted by the active region.

5. The dice of claim 3 wherein the lattice has a lattice constant a and the holes have a diameter between about 0.1 a and about 0.5 a.

6. The device of claim 3 wherein the holes have a depth between about $0.05\lambda$ and about $5\lambda$, where $\lambda$ is a wavelength of light emitted by the active region.

7. The device of claim 3 wherein a lattice type, lattice constant, hole diameter, and hole depth are selected to create a predetermined radiation pattern.

8. A light emitting device comprising:
    a first layer of first conductivity type;
    a first layer of second conductivity type;
    an active region disposed between a layer of first conductivity type and a layer of second conductivity type;
    a tunnel junction, the tunnel junction comprising:
        a second layer of first conductivity type having a dopant concentration greater than the first layer of first conductivity type; and
        a second layer of second conductivity type having a dopant concentration greater than the first layer of second conductivity type; and
    a third layer of first conductivity type;
    wherein a thickness of the third layer of first conductivity type varies periodically;
    wherein the tunnel junction is between the first layer of first conductivity type and the third layer of first conductivity type.

9. The device of claim 8 wherein:
    the second layer of first conductivity type has a dopant concentration ranging from about $10^{18}$ cm$^{-3}$ to about $5 \times 10^{20}$ cm$^{-3}$; and
    the second layer of second conductivity type has a dopant concentration ranging from about $10^{18}$ cm$^{-3}$ to about $5 \times 10^{20}$ cm$^3$.

10. The device of claim 8 wherein the second layer of first conductivity type has a dopant concentration ranging from about $2 \times 10^{20}$ cm$^{-3}$ to about $4 \times 10^{20}$ cm$^{-3}$.

11. The device of claim 8 wherein the second layer of second conductivity type has a dopant concentration ranging from about $7 \times 10^{19}$ cm$^{-3}$ to about $9 \times 10^{19}$ cm$^{-3}$.

12. The device of claim 8 wherein the tunnel junction has a voltage drop ranging from between about 0V to about 1V when operated in reversed-biased mode.

13. The device of claim 8 wherein the tunnel junction has a voltage drop ranging from between about 0.1V to about 1V when operated in reverse-biased mode.

14. The device of claim 8 wherein:
    the second layer of first conductivity type has a thickness ranging from about 1 nm to about 50 nm; and
    the second layer of second conductivity type has a thickness ranging from about 1 nm to about 50 nm.

15. The device of claim 8 wherein the tunnel junction has a thickness ranging from about 2 nm to about 100 nm.

16. The device of claim 8 wherein the active region comprises III-nitride material.

17. The device of claim 8 wherein the periodic variation of thickness comprises a planar lattice of holes.

18. The device of claim 17 wherein the planar lattice is selected from the group consisting of a triangular lattice, a square lattice, a hexagonal lattice, and a honeycomb lattice.

19. The device of claim 17 wherein the planar lattice includes more than one lattice type.

20. The device of claim 17 wherein the lattice has a lattice constant a between about $0.1\lambda$ and about $10\lambda$, where $\lambda$ is a wavelength of light emitted by the active region.

21. The device of claim 17 wherein the lattice has a lattice constant a between about $0.1\lambda$ and about $4\lambda$, wherein $\lambda$ is a wavelength of light emitted by the active region.

22. The device of claim 17 wherein the lattice has a lattice constant a and the holes have a diameter between about 0.1 a and about 0.5 a.

23. The device of claim 17 wherein the holes have a depth between about $0.05\lambda$ and about $5\lambda$, wherein $\lambda$ is a wavelength of light emitted by the active region.

24. The device of claim 17 wherein the holes are filled with a dielectric.

25. The device of claim 24 wherein the dielectric has a dielectric constant between about 1 and about 16.

26. The device of claim 8 wherein the third layer of first conductivity type has a thickness of at least 0.1 microns.

27. The device of claim 8 further comprising:
    a first electrode electrically connected to the first layer of first conductivity type; and
    a second electrode electrically connected to the third layer of first conductivity type.

28. The device of claim 27 wherein the second electrode comprises a sheet attached to the third layer of first conductivity type, wherein the sheet contacts only thicker portions of third layer of first conductivity type.

29. The device of claim 8 wherein the periodic variation of thickness is formed on a first portion of the third layer of first conductivity type, the device further comprising an electrode electrically connected to a second portion of the third layer of first conductivity type.

30. The device of claim 8 wherein a ratio of the period of the periodic structure and the wavelength of light emitted by the active region in air is about 0.1 to about 5.

31. The device of claim 8 wherein:
    the periodic variation of thickness comprises a lattice of holes; and
    a lattice type, lattice constant, hole diameter, and hole depth are selected to create a predetermined radiation pattern.

32. A method comprising:
    forming a first layer of first conductivity type;
    forming a first layer of second conductivity type;
    forming an active region between a layer of first conductivity type and a layer of second conductivity type;
    forming a tunnel junction, the tunnel junction comprising:
        a second layer of first conductivity type having a dopant concentration greater than the first layer of first conductivity type; and a second layer of second conductivity type having a dopant concentration greater than the first layer of second conductivity type;

forming a third layer of first conductivity type; and forming a plurality of holes formed in the third layer of first conductivity type;

wherein:

the tunnel junction is between the first layer of first conductivity type and the third layer of first conductivity type;

the plurality of holes formed a lattice; and a lattice type, lattice constant, hole diameter, and hole depth are selected to create a predetermined radiation pattern.

33. A light emitting device comprising:

a III-nitride semiconductor structure including an active region disposed between a n-type and a p-type region; and a photonic crystal structure formed in an n-type region, the photonic crystal comprising a planar lattice of holes, each of the holes having a depth extending from a top opening to a bottom surface, wherein the top opening of the holes are located on a surface of the n-type region in which the photonic crystal structure is formed.

34. The device of claim 33 wherein the lattice has a lattice constant a between about $0.1\lambda$ and about $10\lambda$, where $\lambda$ is a wavelength of light emitted by the active region.

35. The device of claim 33 wherein the lattice has a lattice constant a and the holes have a diameter between about 0.1 a and about 0.5 a.

36. The device of claim 33 wherein the holes have a depth between about $0.05\lambda$ and about $5\lambda$, where $\lambda$ is a wavelength of light emitted by the active region.

37. The device of claim 33 wherein a lattice type, lattice constant, hole diameter, and hole depth are selected to create a predetermine radiation pattern.

38. The device of claim 33 wherein the bottom surfaces of the holes are located within the n-type region in which the photonic crystal structure is formed.

* * * * *

UNITED STATES PATENT AND TRADEMARK OFFICE
CERTIFICATE OF CORRECTION

| | | |
|---|---|---|
| PATENT NO. | : 7,012,279 B2 | Page 1 of 1 |
| APPLICATION NO. | : 10/691026 | |
| DATED | : March 14, 2006 | |
| INVENTOR(S) | : Jonathan J. Wierer, Jr. et al. | |

It is certified that error appears in the above-identified patent and that said Letters Patent is hereby corrected as shown below:

Column 11, line 19, claim 4: Cancel "wherein" and substitute --where--.

Column 12, line 21, claim 21: Cancel "wherein" and substitute --where--.

Column 12, line 26, claim 23: Cancel "boles" and substitute --holes--.

Column 12, line 27, claim 23: Cancel "wherein" and substitute --where--.

Signed and Sealed this

Twenty-seventh Day of November, 2007

JON W. DUDAS
*Director of the United States Patent and Trademark Office*